（12）United States Patent
Lee et al.

(10) Patent No.: US 11,462,466 B2
(45) Date of Patent: Oct. 4, 2022

(54) FAN-OUT TYPE SEMICONDUCTOR PACKAGES AND METHODS OF MANUFACTURING THE SAME

(71) Applicant: Samsung Electronics Co., Ltd., Gyeonggi-do (KR)

(72) Inventors: Changbo Lee, Asan-si (KR); Joonseok Oh, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 145 days.

(21) Appl. No.: 16/891,663

(22) Filed: Jun. 3, 2020

(65) Prior Publication Data

US 2021/0118792 A1   Apr. 22, 2021

(30) Foreign Application Priority Data

Oct. 22, 2019   (KR) .................. 10-2019-0131072

(51) Int. Cl.
*H01L 23/498* (2006.01)
*H01L 23/31* (2006.01)
(Continued)

(52) U.S. Cl.
CPC ...... *H01L 23/49861* (2013.01); *H01L 21/311* (2013.01); *H01L 21/4857* (2013.01);
(Continued)

(58) Field of Classification Search
CPC ............. H01L 21/565; H01L 23/49861; H01L 2224/0235; H01L 25/0657;
(Continued)

(56) References Cited

U.S. PATENT DOCUMENTS

| 8,018,052 | B2 * | 9/2011 | Kim ................. H01L 23/49833 |
| | | | 257/710 |
| 8,942,004 | B2 | 1/2015 | Hong et al. |
| 9,258,922 | B2 | 2/2016 | Chen et al. |
| 9,502,391 | B2 | 11/2016 | Kwon et al. |

(Continued)

FOREIGN PATENT DOCUMENTS

| KR | 10-0851072 | 8/2008 |
| KR | 10-1362714 | 2/2014 |

(Continued)

*Primary Examiner* — Jasmine J Clark
(74) *Attorney, Agent, or Firm* — Myers Bigel, P.A.

(57) ABSTRACT

A fan-out type semiconductor package may include a frame, a semiconductor chip, a lower photoimageable dielectric (PID), a lower redistribution layer (RDL), a molding member, a first upper RDL, an upper PID and a second upper RDL. The frame may include an insulation substrate having a cavity and a middle RDL formed through the insulation substrate, with the semiconductor chip arranged in the cavity. The first upper RDL may be arranged on an upper surface of the insulation substrate. The first upper RDL may be connected to an upper end of the middle RDL. The upper PID may be formed on upper surfaces of the frame, the semiconductor chip and the molding member. The second upper RDL may be formed in the upper PID. A photolithography process may be applied to the upper PID so that the second upper RDL formed on the upper PID may have a fine pattern.

20 Claims, 11 Drawing Sheets

(51) Int. Cl.
*H01L 21/56* (2006.01)
*H01L 23/00* (2006.01)
*H01L 25/065* (2006.01)
*H01L 21/48* (2006.01)
*H01L 21/311* (2006.01)

(52) U.S. Cl.
CPC ........ *H01L 21/565* (2013.01); *H01L 23/3121* (2013.01); *H01L 24/05* (2013.01); *H01L 25/0657* (2013.01); *H01L 2924/15174* (2013.01)

(58) Field of Classification Search
CPC ........... H01L 2224/02379; H01L 24/05; H01L 23/49816; H01L 23/3121; H01L 21/4857; H01L 23/5226; H01L 2224/05569; H01L 2224/02373; H01L 23/3107; H01L 23/13
See application file for complete search history.

(56) References Cited

U.S. PATENT DOCUMENTS

| | | | |
|---|---|---|---|
| 9,929,100 | B2 | 3/2018 | Lee et al. |
| 10,050,016 | B2 | 8/2018 | Lee et al. |
| 10,347,586 | B2 | 7/2019 | Kim et al. |
| 2008/0211083 | A1 | 9/2008 | Kang et al. |
| 2018/0026023 | A1 | 1/2018 | Lin et al. |
| 2018/0130761 | A1 | 5/2018 | Kim et al. |
| 2018/0197831 | A1 | 7/2018 | Kim et al. |
| 2019/0139853 | A1 | 5/2019 | Oh et al. |
| 2019/0206824 | A1 | 7/2019 | Lu |

FOREIGN PATENT DOCUMENTS

| | | |
|---|---|---|
| KR | 10-2018-0037529 | 4/2018 |
| KR | 10-2018-0052062 | 5/2018 |
| KR | 10-2018-0082849 | 7/2018 |
| KR | 10-1933409 | 12/2018 |

* cited by examiner

FAN-OUT TYPE SEMICONDUCTOR PACKAGES AND METHODS OF MANUFACTURING THE SAME

CROSS-REFERENCE TO RELATED APPLICATION

This application claims priority under 35 U.S.C. § 119 to Korean Patent Application No. 10-2019-0131072, filed on Oct. 22, 2019, in the Korean Intellectual Property Office (KIPO), the contents of which are herein incorporated by reference in their entirety.

TECHNICAL FIELD

Aspects of the present disclosure relate to fan-out type semiconductor packages and to methods of manufacturing the same. More particularly, aspects of the present disclosure relate to fan-out type semiconductor packages that include a redistribution layer configured to position external terminals outside a side surface of a semiconductor chip, and to methods of manufacturing the fan-out type semiconductor package.

BACKGROUND

Generally, a fan-out type semiconductor package may include a frame having a cavity, a semiconductor chip arranged in the cavity, a molding member formed on an upper surface of the frame, a photoimageable dielectric (PID) formed on a lower surface of the frame, a lower redistribution layer (RDL) formed in the PID and electrically connected with the semiconductor chip, and external terminals mounted on portions of the lower RDL outside a side surface of the semiconductor chip.

In order to increase a capacity of the fan-out type semiconductor package, a second semiconductor chip may be arranged on the upper surface of the frame. A middle RDL may be formed in the frame to electrically connect the second semiconductor chip with the lower RDL. An upper RDL may be formed in the molding member. The upper RDL may be electrically connected with the middle RDL. The second semiconductor chip may be arranged on an upper surface of the molding member. The second semiconductor chip may be electrically connected with the upper RDL.

According to related arts, the molding member may include a thermosetting material different from the PID so that a photolithography process may not be applied to the molding member. Thus, the molding member may be patterned by a laser drilling process. As a result, a fine pattern may not be formed at the upper RDL by the laser drilling process.

SUMMARY

Aspects of the present disclosure provide fan-out type semiconductor packages including an upper RDL to which a photolithography process may be applied.

Aspects of the present disclosure also provide methods of manufacturing the above-mentioned fan-out type semiconductor packages.

According to some example embodiments, there may be provided a fan-out type semiconductor package. The fan-out type semiconductor package may include a frame, a semiconductor chip, a lower photoimageable dielectric (PID), a lower redistribution layer (RDL), a molding member, a first upper RDL, an upper PID and a second upper RDL. The frame may include an insulation substrate having a cavity and a middle RDL in the insulation substrate. The semiconductor chip may be in the cavity. The lower PID may be on a lower surface of the frame. The lower RDL may be formed in the lower PID. The lower RDL may be connected to the semiconductor chip and a lower end of the middle RDL. The molding member may be in the cavity and in contact with the semiconductor chip. The first upper RDL may be on an upper surface of the insulation substrate. The first upper RDL may be connected to an upper end of the middle RDL. The upper PID may be formed on an upper surface of the frame, an upper surface of the semiconductor chip, and an upper surface of the molding member. The second upper RDL may be formed in the upper PID. The second upper RDL may be connected to the first upper RDL.

According to some example embodiments, there may be provided a fan-out type semiconductor package. The fan-out type semiconductor package may include a frame, a first semiconductor chip, a lower PID, a lower RDL, a molding member, a first upper RDL, an upper PID, a second upper RDL, a second semiconductor chip and external terminals. The frame may include an insulation substrate having a cavity and a middle RDL in the insulation substrate. The first semiconductor chip may be in the cavity. The lower PID may be on a lower surface of the frame. The lower RDL may be formed in the lower PID. The lower RDL may be connected to the semiconductor chip and a lower end of the middle RDL. The molding member may be between the first semiconductor chip and an inner surface of the cavity. The first upper RDL may be on an upper surface of the insulation substrate. The first upper RDL may be connected to an upper end of the middle RDL. The upper PID may be on an upper surface of the frame, an upper surface of the first semiconductor chip and an upper surface of the molding member. The second upper RDL may be in the upper PID. The second upper RDL may be connected to the first upper RDL. The second semiconductor chip may be on an upper surface of the upper PID. The second semiconductor chip may be electrically connected with the second upper RDL. The external terminals may be mounted on the lower RDL.

According to some example embodiments, there may be provided a method of manufacturing a fan-out type semiconductor package. In the method of manufacturing the fan-out type semiconductor package, a seed layer may be formed an upper surface of a frame. The frame may include an insulation substrate and a middle RDL formed through the insulation substrate. The seed layer may be connected to the middle RDL. First upper RDLs may be formed from the seed layer. The insulation substrate may be partially removed to form a cavity in the insulation substrate. A semiconductor chip may be arranged in the cavity. A molding member may be formed on an upper surface of the insulation substrate, upper surfaces of the first upper RDLs and an upper surface of the semiconductor chip, with the molding member filling a space between the semiconductor chip and an inner surface of the cavity. A lower PID may be formed on a lower surface of the frame. A lower RDL may be formed in the lower PID by a photolithography process. The lower RDL may be connected to the semiconductor chip and a lower end of the middle RDL. A portion of the molding member on the upper surfaces of the insulation substrate and the first upper RDLs may be removed to expose the first upper RDLs. An upper PID may be formed on the upper surfaces of the insulation substrate, the semiconductor chip and the molding member to cover the first upper RDLs with the upper PID. A second upper RDL may be formed in the upper PID by a photolithography process. The second upper RDL may be connected to the first upper RDLs.

According to some example embodiments, after removing the molding member on the upper surface of the insulation substrate, the upper PID layer may be formed on the upper surface of the insulation substrate. Thus, the photolithography process may be applied to the upper PID so that the second upper RDL having a fine pattern may be formed on the upper PID.

BRIEF DESCRIPTION OF THE DRAWINGS

Example embodiments will be more clearly understood from the following detailed description taken in conjunction with the accompanying drawings.

FIG. 1 is a cross-sectional view illustrating a fan-out type semiconductor package in accordance with some example embodiments;

FIG. 2 is an enlarged cross-sectional view illustrating a portion "A" in FIG. 1;

FIGS. 3 to 14 are cross-sectional views illustrating a method of manufacturing the semiconductor package in FIG. 1;

FIG. 15 is a cross-sectional view illustrating a fan-out type semiconductor package in accordance with some example embodiments; and FIGS. 16 to 22 are cross-sectional views illustrating a method of manufacturing the semiconductor package in FIG. 15.

DETAILED DESCRIPTION

Hereinafter, aspects of the present disclosure will be explained in detail with reference to some example embodiments illustrated in the accompanying drawings.

Figure 1:
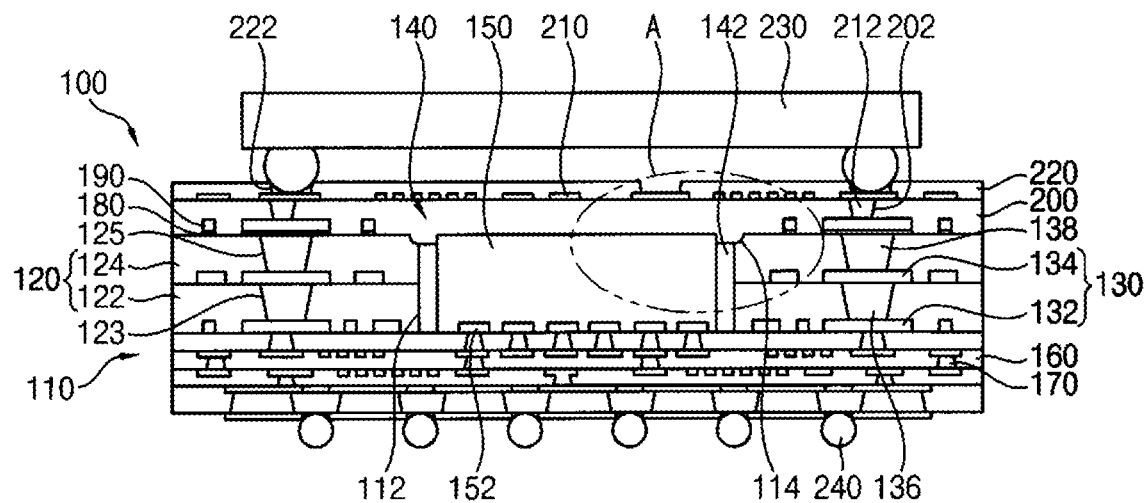
FIGS. 1 to 22 represent non-limiting, example embodiments as described herein.
Figure 2:
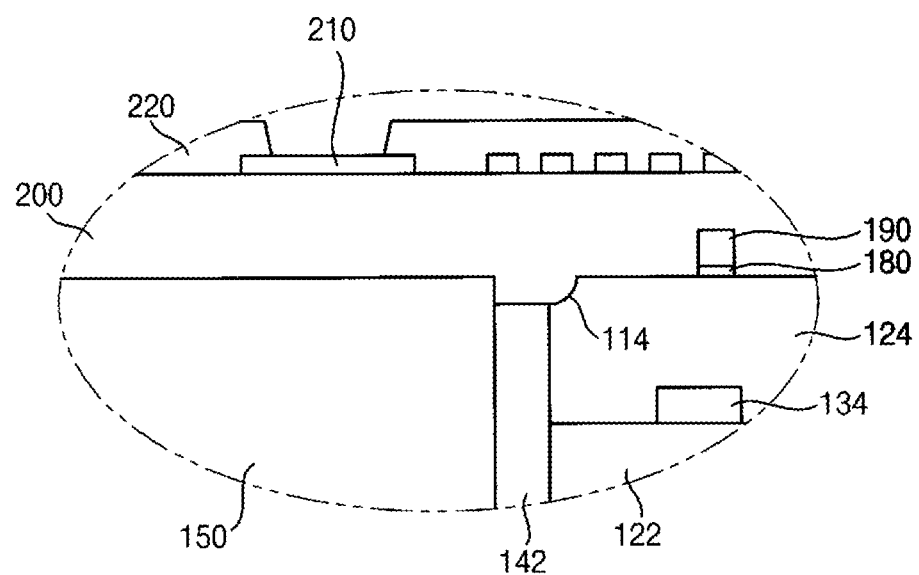

FIG. 1 is a cross-sectional view illustrating a fan-out type semiconductor package in accordance with some example embodiments, and FIG. 2 is an enlarged cross-sectional view illustrating a portion "A" in FIG. 1.

Referring to FIGS. 1 and 2, a fan-out type semiconductor package 100 according to some example embodiments may include a frame 110, a first semiconductor chip 150, a molding member 140, a lower photoimageable dielectric (PID) 160, a lower redistribution layer (RDL) 170, a seed layer 180, a first upper RDL 190, an upper PID 200, a second upper RDL 210, a second semiconductor chip 230 and external terminals 240.

The frame 110 may include an insulation substrate 120 and a middle RDL 130. The insulation substrate 120 may include a cavity 112. The cavity 112 may be vertically formed through a central portion of the insulation substrate 120. The middle RDL 130 may be formed in the insulation substrate 120.

In some example embodiments, the insulation substrate 120 may include a first insulation layer 122 and a second insulation layer 124. The first insulation layer 122 may have an opening 123 vertically formed through the first insulation layer 122. The second insulation layer 124 may be formed on an upper surface of the first insulation layer 122. The second insulation layer 124 may have an opening 125 vertically formed through the second insulation layer 124.

The middle RDL 130 may include a first middle RDL pattern 132 and a second middle RDL pattern 134. The first middle RDL pattern 132 may be formed on a lower surface of the first insulation layer 122. The second middle RDL pattern 134 may be formed on the upper surface of the first insulation layer 122. The opening 123 of the first insulation layer 122 may be filled with a first contact 136. Thus, the first middle RDL pattern 132 and the second middle RDL pattern 134 may be electrically connected with each other via the first contact 136. The opening 125 of the second insulation layer 124 may be filled with a second contact 138. The second contact 138 may be electrically connected with the second middle RDL pattern 134. An upper surface of the second contact 138 may be upwardly exposed.

In some example embodiments, the insulation substrate 120 may include a single layer. In such example embodiments, a single middle RDL may be exposed through the single insulation layer. In some example embodiments, the insulation substrate 120 may include at least three insulation layers. In other words, although the insulation substrate 120 of FIG. 1 is shown as including a first insulation layer 122 and a second insulation layer 124, the present disclosure is not limited thereto.

The first semiconductor chip 150 may be arranged in the cavity 112 of the insulation substrate 120. The first semiconductor chip 150 may include a plurality of pads 152. The pads 152 may be arranged on a lower surface of the first semiconductor chip 150. In some example embodiments, the first semiconductor chip 150 may have an upper surface that is substantially coplanar with an upper surface of the insulation substrate 120. In some example embodiments, the upper surface of the first semiconductor chip 120 may be located on a plane that is higher or lower than the upper surface of the insulation substrate 120.

The molding member 140 may be configured to mold the first semiconductor chip 150. In some example embodiments, the molding member 140 may include a burying portion 142 configured to bury or fill a space between the first semiconductor chip 150 and an inner surface of the cavity 112.

The burying portion 142 may have an upper surface and a lower surface. The lower surface of the burying portion 142 may be substantially coplanar with the lower surface of the insulation substrate 120. In contrast, the upper surface of the burying portion 142 may be lower than the upper surface of the insulation substrate 120. A groove 114 may be formed at an upper end of an inner surface of the insulation substrate 120 that is configured to make contact with the upper surface of the burying portion 142. The groove 114 may be formed at the upper end of the inner surface of the insulation substrate 120 by removing the molding member 140. In some example embodiments, the groove 114 may not be formed at the upper end of the inner surface of the insulation substrate 120. In such embodiments, the upper end of the inner surface of the insulation substrate 120 may have a right angular structure located on a plane higher than the upper surface of the burying portion 142.

The lower PID 160 may be formed on the lower surfaces of the insulation substrate 120 and the first semiconductor chip 150. The lower PID 160 may include a plurality of stacked insulation layers. Each of the insulation layers of the lower PID 160 may have a via hole. The via holes of the insulation layers may be formed by a photolithography process. The via holes formed by the photolithography process may have a fine pattern.

The lower RDL 170 may be formed in the lower PID 160. The lower RDL 170 may be exposed from the side surface of the first semiconductor chip 150 in a horizontal direction to form a fan-out structure. When the lower PID 160 includes a plurality of stacked insulation layers, the lower RDL 170 may also include a plurality of lower RDL patterns. The lower RDL 170 may be electrically connected to a lower end of the middle RDL 130. Further, the lower RDL 170 may be electrically connected with the pads 152 of the first semiconductor chip 150. The lower RDL 170 may be partially exposed through the lower PID 160 in a downward direction. The external terminals 240 may be mounted on exposed portions of the lower PID 170.

The seed layer 180 may be partially formed on the upper surface of the insulation substrate 120. The seed layer 180 may be electrically connected to an upper end of the middle RDL 130. Particularly, the seed layer 180 may be electrically connected to the second contact 138 of the middle RDL 130. The seed layer 180 may include a metal such as copper, titanium, an alloy of copper and titanium, or the like.

The first upper RDL 190 may be formed on an upper surface of the seed layer 180. The first upper RDL 190 may be formed from the seed layer 180 by a plating process. Thus, the first upper RDL 190 may have a pattern substantially the same as that of the seed layer 180.

The upper PID 200 may be formed on the upper surface of the frame 110. Particularly, the upper PID 200 may be formed on the upper surfaces of the insulation substrate 120, the first semiconductor chip 150 and the burying portion 142. Thus, the upper PID 200 may be configured to cover the first upper RDL 190. The upper PID 200 may include a plurality of via holes 202 configured to partially expose the first upper RDL 190.

Because the upper PID 200 may include a photoimageable material, a photolithography process may be applied to the upper PID 200. As a result, the via holes 202 formed through the upper PID 200 by the photolithography process may have a fine pattern.

The second upper RDL 210 may be formed on an upper surface of the upper PID 200. The second upper RDL 210 may include contacts 212 configured to bury or fill the via holes 202 of the upper PID 200. The second upper RDL 210 may be electrically connected with the first upper RDL 190 via the contacts 212. As mentioned above, because the via holes 202 of the upper PID 200 formed by the photolithography process may have a fine pattern, the second upper RDL 210 may also have a fine pattern.

The second upper PID 220 may be formed on an upper surface of the upper PID 200 to cover the second upper RDL 210. The second upper PID 220 may include via holes 222 configured to partially expose the second upper RDL 210.

The second semiconductor chip 230 may be arranged on an upper surface of the second upper PID 220. Pads of the second semiconductor chip 230 may be electrically connected with the second upper RDL 210 exposed through the via holes 222 of the second upper PID 220 via conductive bumps.

FIGS. 3 to 14 are cross-sectional views illustrating a method of manufacturing the semiconductor package in FIG. 1.

Figure 3:
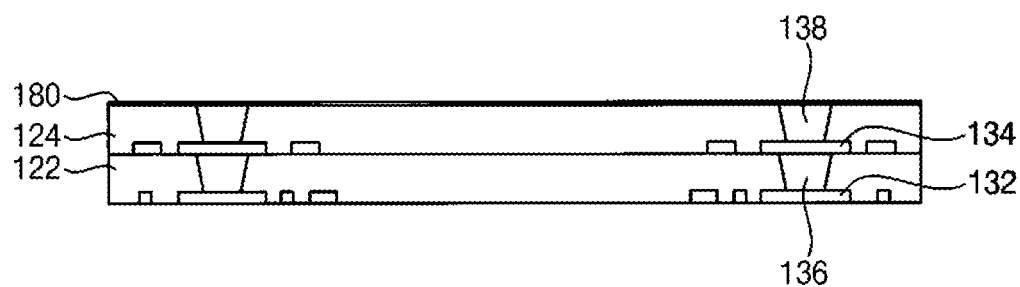

Referring to FIG. 3, the seed layer 180 may be formed on the upper surface of the frame 110. Particularly, the seed layer 180 may be formed on the upper surface of the insulation substrate 120. The seed layer 180 may be electrically connected to the upper end of the middle RDL 130. The seed layer 180 may be formed by a plating process.

Figure 4:
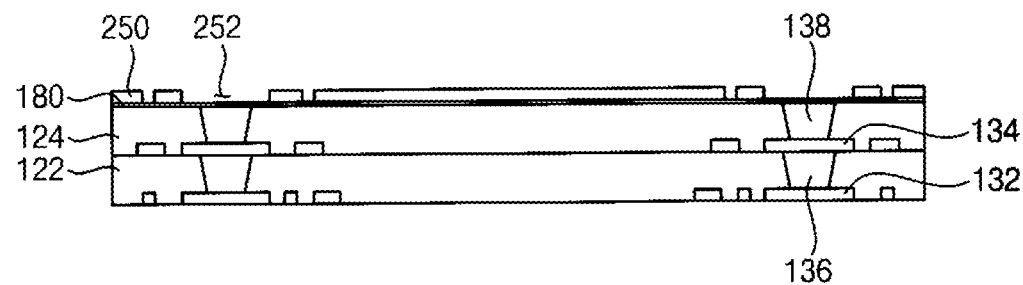

Referring to FIG. 4, a photoresist pattern 250 may be formed on the upper surface of the seed layer 180. The photoresist pattern 250 may have openings 252 configured to expose the seed layer 180.

Figure 5:
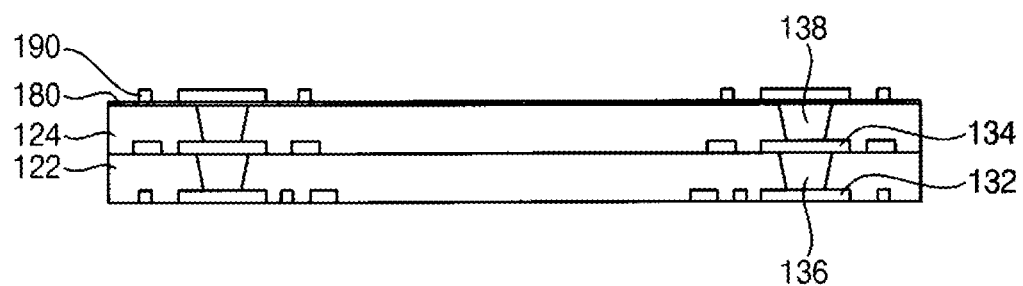

Referring to FIG. 5, a plating process may be performed on the seed layer 180 exposed through the openings 252 of the photoresist pattern 250 to form the first upper RDL 190 on the seed layer 180.

When the photoresist pattern 250 may then be removed, the first upper RDL 190 may remain on the upper surface of the seed layer 180. The first upper RDL 190 may be electrically connected with the upper end of the middle RDL 130 via the seed layer 180.

Figure 6:
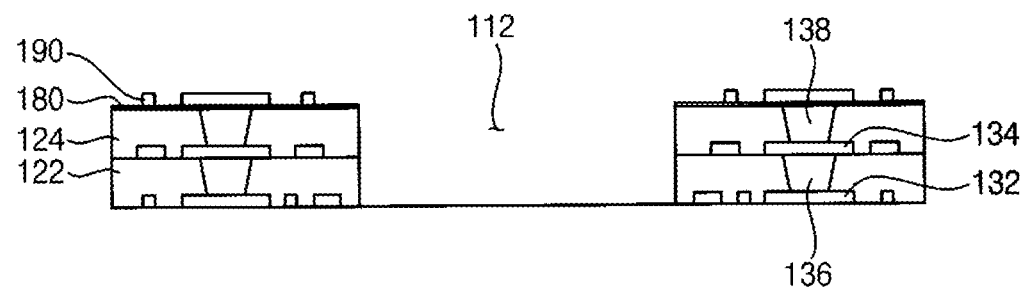

Referring to FIG. 6, the central portion of the insulation substrate 120 and the seed layer 180 on the central portion of the insulation substrate 120 may be removed to form the cavity 112 in the insulation substrate 120.

Figure 7:
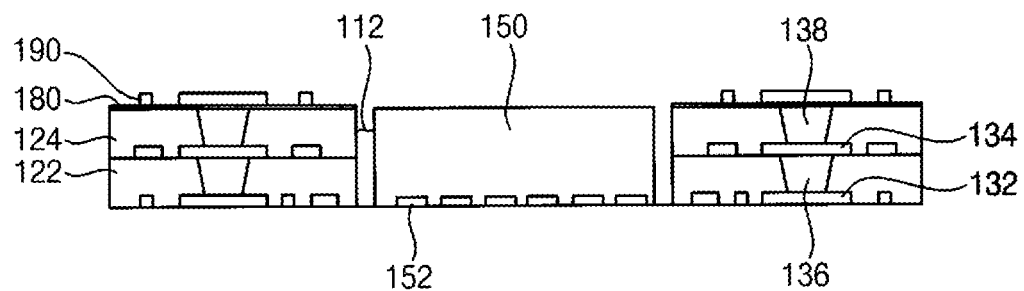

Referring to FIG. 7, the first semiconductor chip 150 may be arranged in the cavity 112. The pads 152 of the first semiconductor chip 150 may be oriented in the downward direction.

Figure 8:
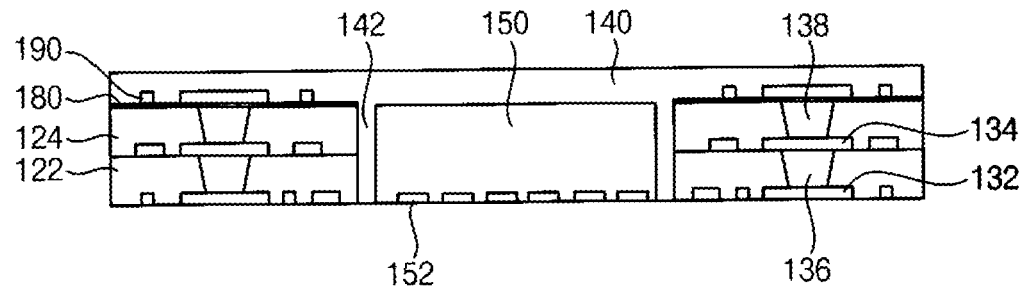

Referring to FIG. 8, the molding member 140 may be formed on the upper surfaces of the molding member 120 and the first semiconductor chip 150. The molding member 140 may include the burying portion 142 configured to bury or fill the space between the side surfaces of the first semiconductor chip 150 and the inner surfaces of the cavity 112. The molding member 140 may be configured to cover the first upper RDL 190.

Figure 9:
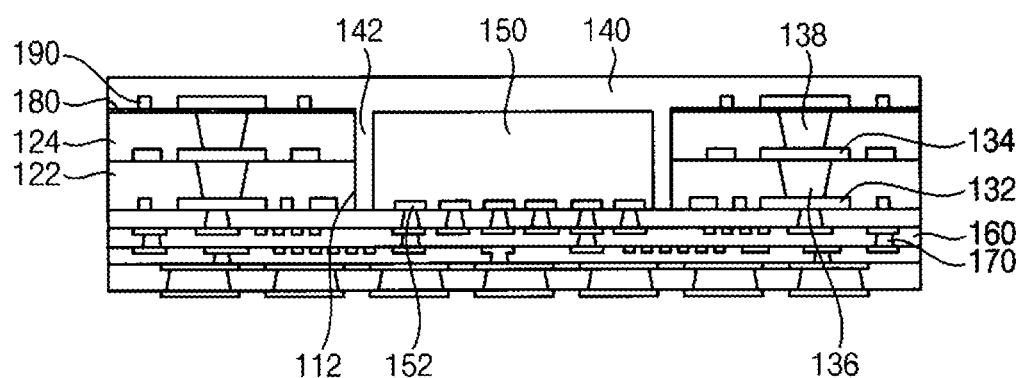

Referring to FIG. 9, the lower PID 160 may be formed on the lower surfaces of the insulation substrate 120 and the first semiconductor chip 150. The lower RDL 170 may be formed in the lower PID 160. The lower RDL 170 may be electrically connected to the middle RDL 130 and the pads 152 of the first semiconductor chip 150. The lower RDL 170 may be exposed through the via holes of the lower PID 160.

Figure 10:
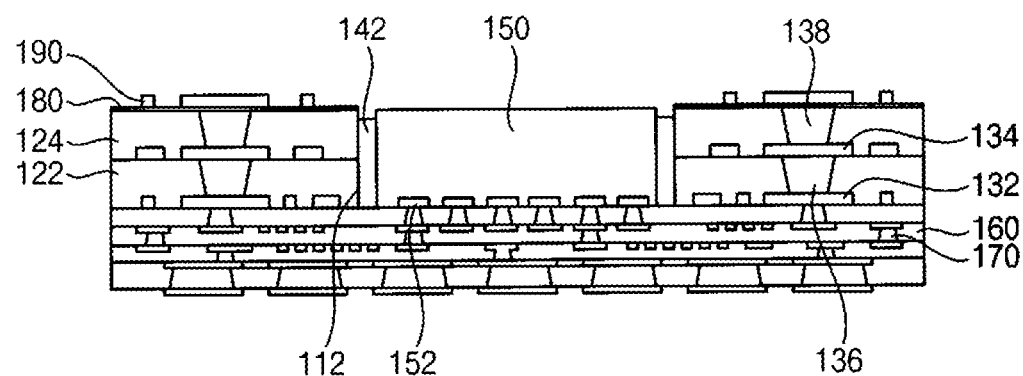

Referring to FIG. 10, the molding member 140 may be removed to expose the upper surfaces of the insulation substrate 120 and the first semiconductor chip 150. The first upper RDL 190 may also be exposed by removing the molding member 140. Thus, only the burying portion 142 may remain in the space between the first semiconductor chip 150 and the inner surface of the cavity 112.

The molding member 140 may be removed using a laser. Because the molding member 140 may be removed until the upper surfaces of the insulation substrate 120 and the first semiconductor chip 150 may be exposed, the upper end of the inner surface of the insulation substrate 120 making contact with the upper surface of the burying portion 142 may also be partially removed to form the groove 114. In some example embodiments, the laser may not be applied to the upper end of the inner surface of the insulation substrate 120, and the upper end of the inner surface of the insulation substrate 120 may have a right angular structure higher than the upper surface of the burying portion 142.

Figure 11:
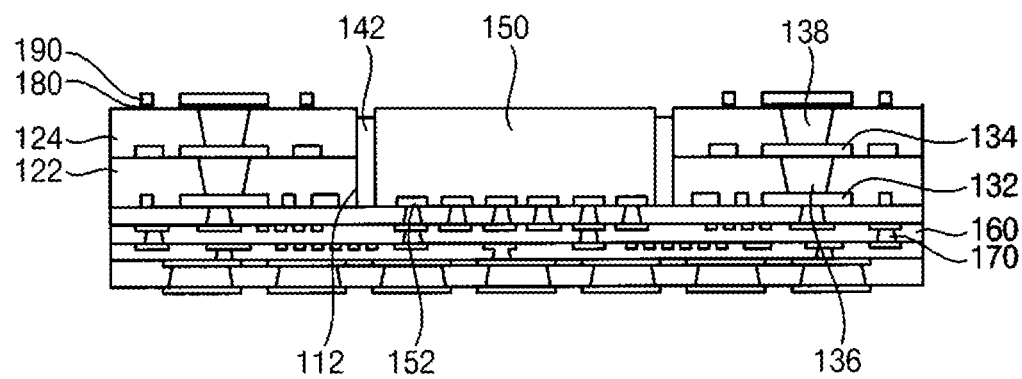

Referring to FIG. 11, portions of the seed layer 180 between the first upper RDLs 190 may be removed to partially expose the upper surface of the insulation substrate 120. Portions of the seed layer 180 may remain under the first upper RDL 190. The portions of the seed layer 180 that are between the first upper RDLs 190 may be removed by a flash etching process.

Figure 12:
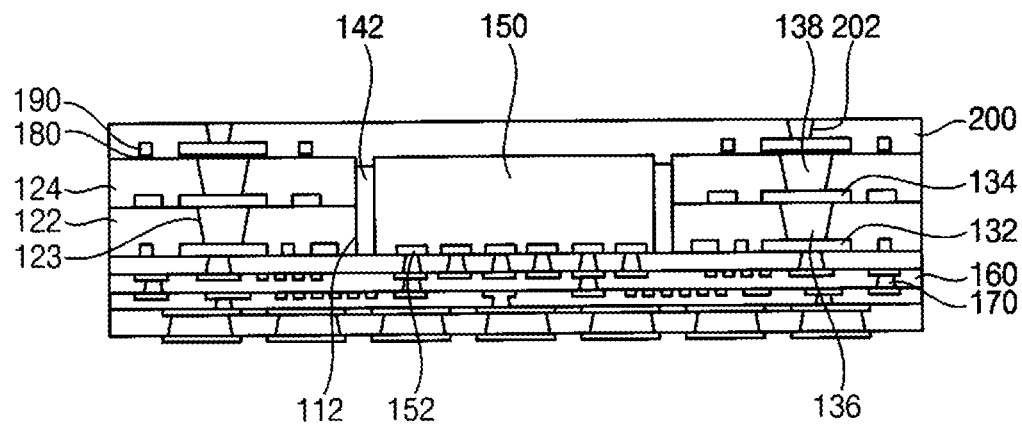

Referring to FIG. 12, the upper PID 200 may be formed on the upper surface of the insulation substrate 120 to cover the first upper RDL 190 with the upper PID 200. Particularly, the upper PID 200 may be formed on the upper surfaces of the insulation substrate 120, the first semiconductor chip 150 and on the burying portion 142.

The photolithography process may be performed on the upper PID 200 to form the via holes 202 configured to expose the first upper RDL 190.

Figure 13:
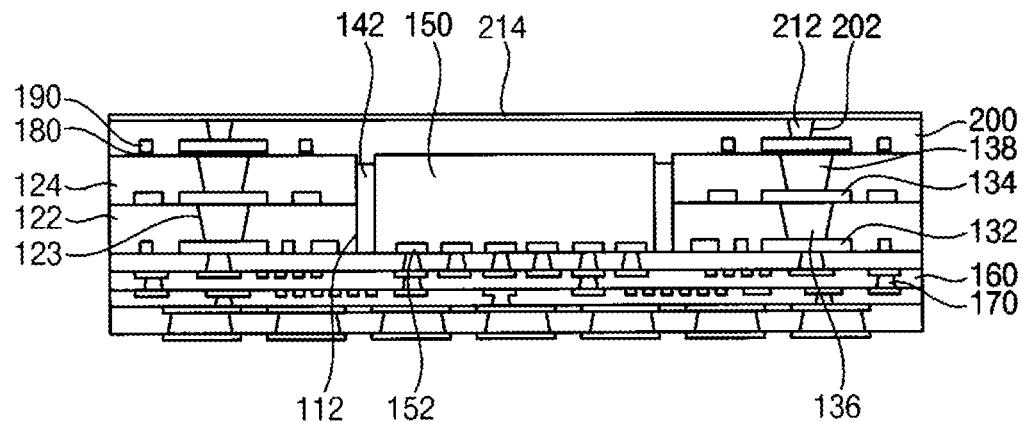

Referring to FIG. 13, a conductive layer 214 may be formed on the upper surface of the upper PID 200.

Figure 14:
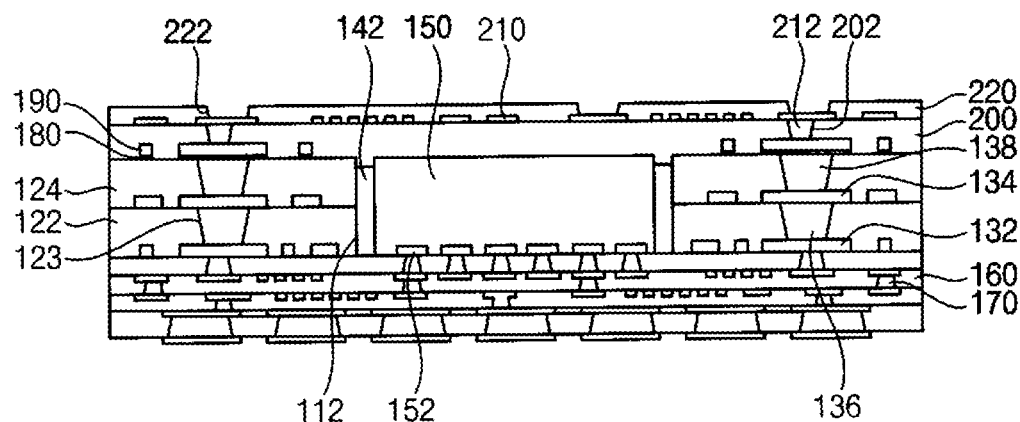

Referring to FIG. 14, the conductive layer 214 may be patterned to form the second upper RDL 210 on the upper PID 200. The contacts 212 of the second upper RDL 210 may be configured to fill the via holes 202 of the upper PID 200.

As mentioned above, the via holes 202 of the upper PID 200 formed by the photolithography process may have a fine pattern so that the contacts 212 configured to bury or fill the via holes 202 may also have a fine pattern. As a result, the second upper RDL 210 may have a fine pattern.

The second upper PID 220 may be formed on the upper surface of the upper PID 200 to cover the second RDL 210. The second semiconductor chip 230 may be arranged on the upper surface of the second upper PID 220. The external terminals 240 may be mounted on the lower RDL 170 to complete the fan-out type semiconductor package 100 in FIG. 1.

Figure 15:
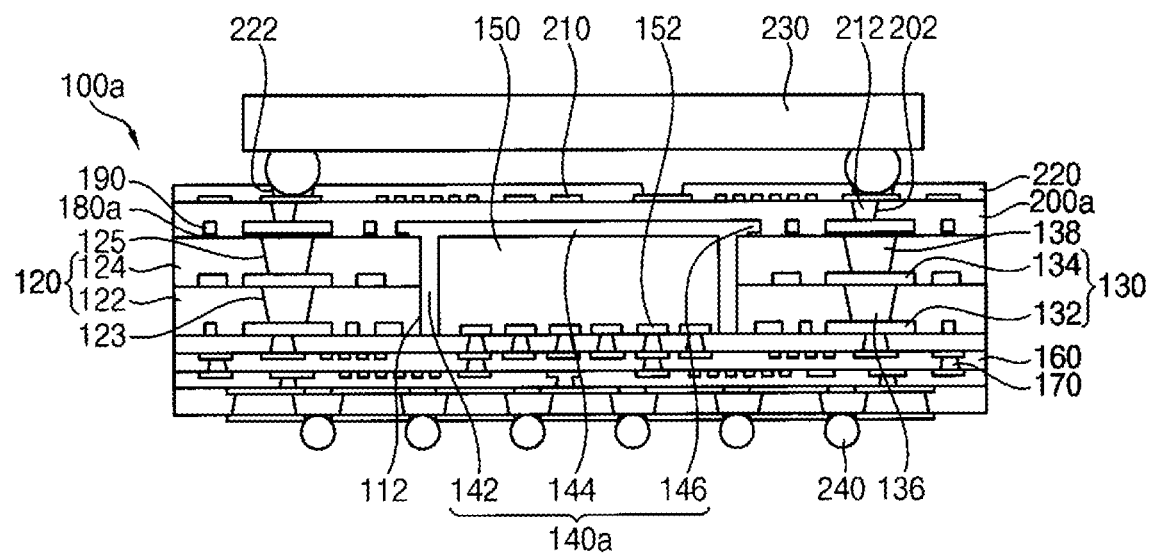

FIG. 15 is a cross-sectional view illustrating a fan-out type semiconductor package in accordance with some example embodiments.

A semiconductor package 100a of this example embodiment may include elements substantially the same as those of the semiconductor package 100 in FIG. 1 except for a molding member 140a and an upper PID 200a. Thus, reference numerals that are the same between FIG. 1 and FIG. 15 refer to the same elements, and any further description of elements described with respect to FIG. 1 may be omitted below for brevity.

Referring to FIG. 15, a molding member 140a may further include a cover 144 and a protrusion 146. The cover 144 may be formed on the upper surface of the burying portion 142 to cover the upper surface of the first semiconductor chip 150. The protrusion 146 may be horizontally extended from both side surfaces of the cover 144. Particularly, the protrusion 146 may be spaced apart from the upper surface of the insulation substrate 120. Thus, a space may be formed between a lower surface of the protrusion 146 and the upper surface of the insulation substrate 120. Alternatively, the side surfaces of the cover 144 may be vertically extended from the upper surface of the insulation substrate 120 so that the space may not be formed between the protrusion 146 and the insulation substrate 120.

Because the molding member 140a may include the cover 144 configured to cover the upper surface of the first semiconductor chip 150, an upper PID 200a may not make contact with the upper surface of the first semiconductor chip 150. The upper PID 200a may be configured to cover an upper surface of the cover 144.

FIGS. 16 to 22 are cross-sectional views illustrating a method of manufacturing the semiconductor package in FIG. 15.

Figure 16:
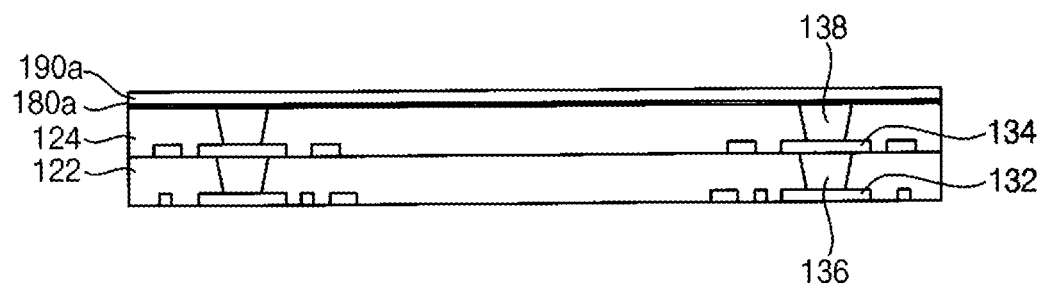

Referring to FIG. 16, the seed layer 180a may be formed on the upper surface of the frame 110. Particularly, the seed layer 180a may be formed on the upper surface of the insulation substrate 120. The seed layer 180a may be electrically connected to the upper end of the middle RDL 130. The seed layer 180a may be formed by a plating process.

A plating process 180a may be performed on the seed layer 180 to form a conductive layer 190a. The conductive layer 190a may be a part of the first upper RDL 190 formed later. Thus, the conductive layer 190a may have a thickness substantially the same as that of the first RDL 190. Particularly, the thickness of the conductive layer 190a may be removed by a tenting etch process performed later. For example, the thickness of the conductive layer 190a may be about 2 μm to about 20 μm.

Figure 17:
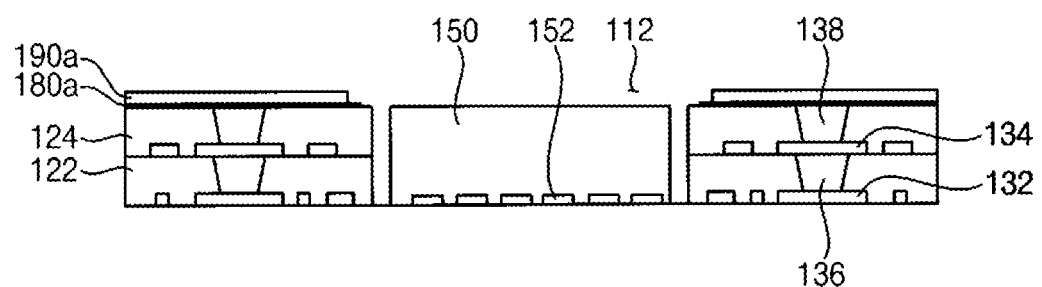

Referring to FIG. 17, the central portion of the insulation substrate 120 and the seed layer 180a and the conductive layer 190a on the central portion of the insulation substrate 120 may be removed to form the cavity 112 in the insulation substrate 120.

The first semiconductor chip 150 may be arranged in the cavity 112. The pads 152 may be oriented toward the downward direction.

Figure 18:
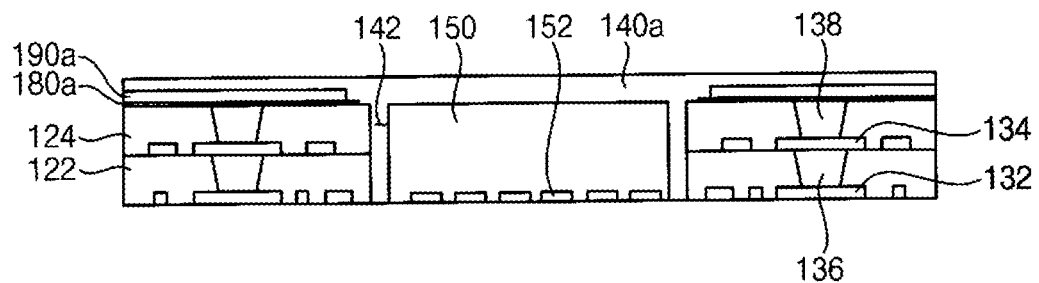

Referring to FIG. 18, the molding member 140a may be formed on the upper surfaces of the insulation substrate 120 and the first semiconductor chip 150. The molding member 140a may include the burying portion 142 configured to bury the space between the side surfaces of the first semiconductor chip 150 and the inner surfaces of the cavity 112.

Figure 19:
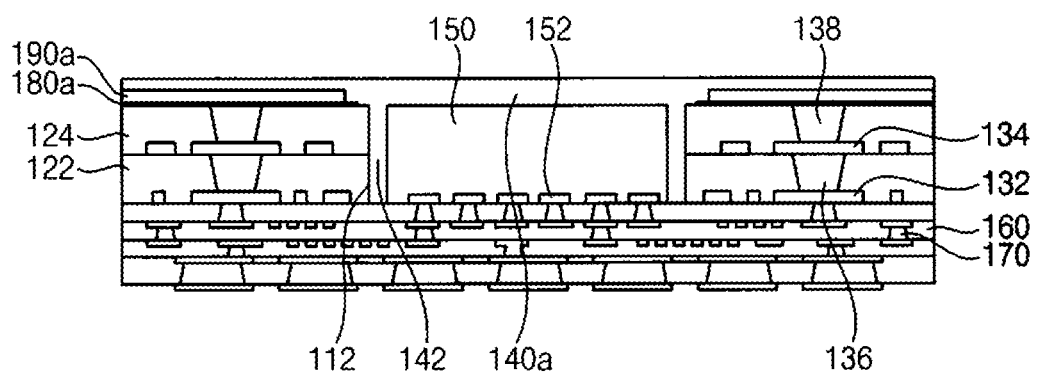

Referring to FIG. 19, the lower PID 160 may be formed on the lower surfaces of the insulation substrate 120 and the first semiconductor chip 150. The lower RDL 170 may be formed in the lower PID 160. The lower RDL 170 may be electrically connected to the middle RDL 130 and the pads 152 of the first semiconductor chip 150. The lower RDL 170 may be exposed through the via holes of the lower PID 160.

Figure 20:
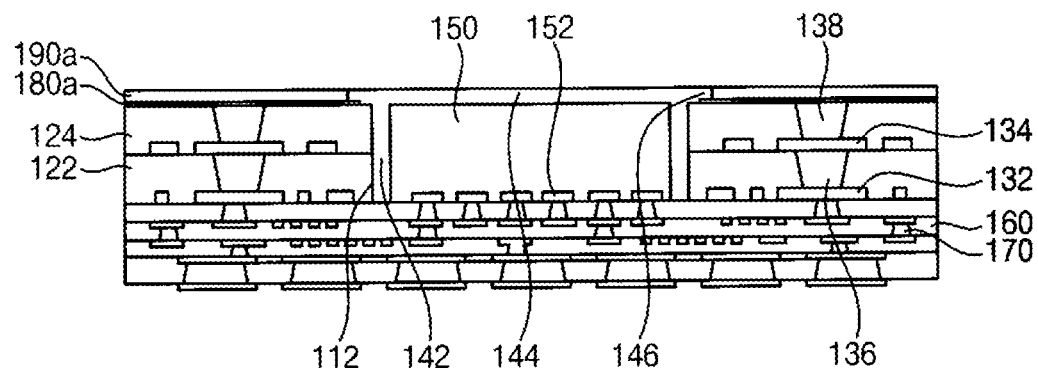

Referring to FIG. 20, the molding member 140a may be removed to expose the upper surfaces of the insulation substrate 120. The conductive layer 180a may also be exposed by removing the molding member 140a. In contrast, a portion of the molding member 140a on the upper surface of the first semiconductor chip 150 may not be removed. Thus, the cover 144 of the molding member 140 may cover the upper surface of the first semiconductor chip 150.

Figure 21:
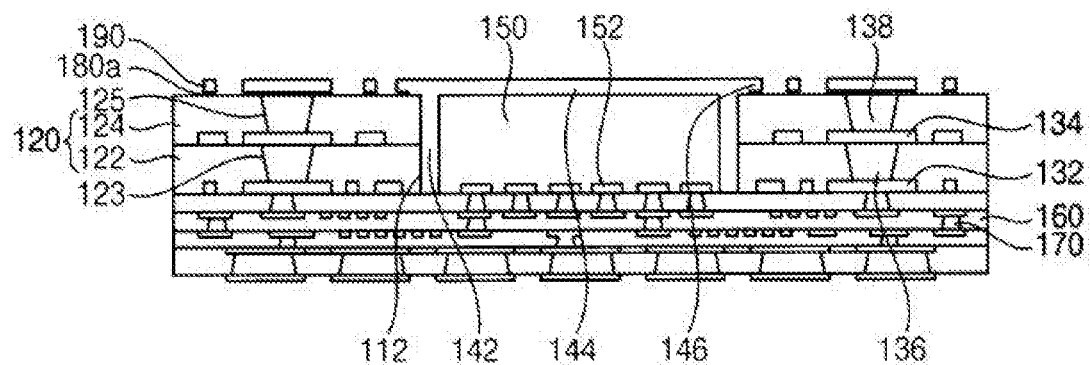

Referring to FIG. 21, a tenting etch process may be performed on the conductive layer 190a to form the first upper RDL 190.

Particularly, a photoresist pattern may be formed on the upper surface of the conductive layer 190a. The conductive layer 190a and the seed layer 180a exposed through openings of the photoresist pattern may be removed by an etch process. As mentioned above, because the thickness of the conductive layer 190a may be removed by the tenting etch process, the conductive layer 190a may be readily removed by the tenting etch process.

A lower portion of a side surface of the cover 144 may be partially removed by the tenting etch process to form the space. Thus, the protrusion 146 horizontally protruded from the cover 144 may be formed by the space. Alternatively, when the lower portion of the side surface of the cover 144 may not be removed by the tenting etch process, the space may not be formed. Thus, the protrusion 146 may also not be formed on the side surfaces of the cover 144.

Figure 22:
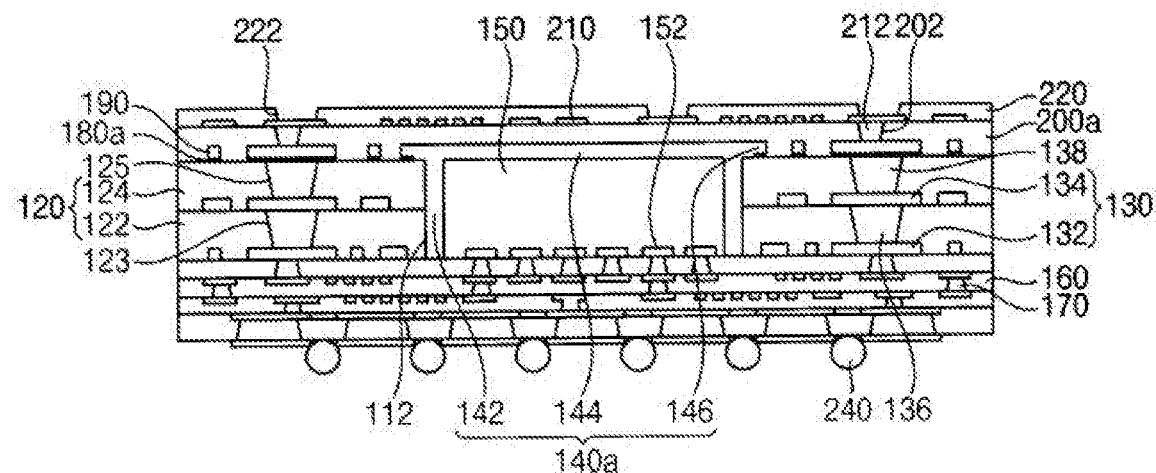

Referring to FIG. 22, the upper PID 200a may be formed on the upper surfaces of the insulation substrate 120 and the cover 144 of the molding member 140a to cover the first upper RDL 190 with the upper PID 200a.

The photolithography process may be performed on the upper PID 200a to form the via holes 202 configured to expose the first upper RDL 190.

A conductive layer may be formed on the upper surface of the upper PID 200a. The conductive layer may be patterned to form the second upper RDL 210 on the upper surface of the upper PID 200a. The contacts 212 of the second upper RDL 210 may bury or fill the via holes 202 of the upper PID 200a.

The second upper PID 220 may be formed on the upper PID 200a to cover the second upper RDL 210. The second semiconductor chip 230 may be arranged on the upper surface of the second upper PID 220. The external terminals 240 may be mounted on the lower RDL 170 to complete the fan-out type semiconductor package 100a in FIG. 15.

According to some example embodiments, after removing the molding member on the upper surface of the insulation substrate, the upper PID layer may be formed on the upper surface of the insulation substrate. Thus, the photolithography process may be applied to the upper PID so that the second upper RDL having a fine pattern may be formed on the upper PID.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A fan-out type semiconductor package comprising:
   a frame including an insulation substrate having a cavity and a middle redistribution layer (RDL) in the insulation substrate;
   a semiconductor chip in the cavity;
   a lower photoimageable dielectric (PID) on a lower surface of the frame;
   a lower RDL in the lower PID and connected to the semiconductor chip and a lower end of the middle RDL;
   a molding member in the cavity and in contact with the semiconductor chip;
   a first upper RDL on an upper surface of the insulation substrate and connected to an upper end of the middle RDL;
   an upper PID on an upper surface of the frame, an upper surface of the semiconductor chip and on an upper surface of the molding member; and
   a second upper RDL in the upper PID and connected to the first upper RDL.

2. The fan-out type semiconductor package of claim 1, wherein the molding member comprises a burying portion in the cavity between the semiconductor chip and an inner surface of the cavity.

3. The fan-out type semiconductor package of claim 2, wherein the burying portion has an upper surface lower than the upper surface of the insulation substrate.

4. The fan-out type semiconductor package of claim 3, comprising a groove at an upper end of an inner surface of the insulation substrate making contact with the upper surface of the burying portion.

5. The fan-out type semiconductor package of claim 1, wherein the molding member comprises a cover arranged on the upper surface of the semiconductor chip.

6. The fan-out type semiconductor package of claim 5, wherein the molding member further comprises a protrusion that extends from both side surfaces of the cover in parallel to the upper surface of the semiconductor chip, and wherein the protrusion is spaced apart from the upper surface of the insulation substrate.

7. The fan-out type semiconductor package of claim 1, further comprising a seed layer between the insulation substrate and the first upper RDL.

8. The fan-out type semiconductor package of claim 1, further comprising a second semiconductor chip on an upper surface of the upper PID and electrically connected to the second upper RDL.

9. The fan-out type semiconductor package of claim 1, further comprising external terminals mounted on the lower RDL.

10. A fan-out type semiconductor package comprising:
    a frame including an insulation substrate having a cavity and a middle redistribution layer (RDL) in the insulation substrate;
    a first semiconductor chip in the cavity;
    a lower photoimageable dielectric (PID) on a lower surface of the frame;
    a lower RDL in the lower PID and connected to the first semiconductor chip and a lower end of the middle RDL;
    a molding member between the first semiconductor chip and an inner surface of the cavity;
    a first upper RDL on an upper surface of the insulation substrate and connected to an upper end of the middle RDL;
    an upper PID on an upper surface of the frame, an upper surface of the first semiconductor chip and an upper surface of the molding member;
    a second upper RDL in the upper PID and connected to the first upper RDL;
    a second semiconductor chip on an upper surface of the upper PID and electrically connected to the second upper RDL; and
    external terminals mounted on the lower RDL.

11. The fan-out type semiconductor package of claim 10, wherein the molding member has an upper surface that is lower than the upper surface of the insulation substrate.

12. The fan-out type semiconductor package of claim 11, further comprising a groove at an upper end of an inner surface of the insulation substrate contacting the upper surface of the molding member.

13. The fan-out type semiconductor package of claim 10, further comprising a seed layer between the insulation substrate and the first upper RDL.

14. A method of manufacturing a fan-out type semiconductor package, the method comprising:
    forming a seed layer on an upper surface of a frame, the frame including an insulation substrate and a middle redistribution layer (RDL) formed through the insulation substrate, and the seed layer connected to the middle RDL;
    forming first upper RDLs from the seed layer;
    partially removing the insulation substrate to form a cavity in the frame;
    arranging a semiconductor chip in the cavity;
    forming a molding member on an upper surface of the insulation substrate, upper surfaces of the first upper RDLs, and an upper surface of the semiconductor chip, wherein the molding member fills a space between the semiconductor chip and an inner surface of the cavity;
    forming a lower PID on a lower surface of the frame;
    forming a lower RDL, which is connected to the semiconductor chip and a lower end of the middle RDL, in the lower PID by a photolithography process;
    removing portions of the molding member on the upper surfaces of the insulation substrate and the first upper RDLs to expose the first upper RDLs;
    forming an upper PID on the insulation substrate, the semiconductor chip and the molding member to cover the first upper RDLs with the upper PID; and
    forming a second upper RDL, which is connected to the first upper RDLs, in the upper PID by a photolithography process.

15. The method of claim 14, wherein the forming first upper RDLs from the seed layer comprises:
   forming a photoresist pattern having openings on an upper surface of the seed layer; and
   applying a plating process on portions of the seed layer exposed through the openings of the photoresist pattern to form the first upper RDLs.

16. The method of claim 14, further comprising removing portions of the seed layer after the removing portions of the molding member on the upper surfaces of the insulation substrate and the first upper RDLs to expose the first upper RDLs.

17. The method of claim 16, wherein the portions of the seed layer are removed by a flash etch process.

18. The method of claim 14, wherein the forming first upper RDLs from the seed layer comprises:
   forming a conductive layer, which is connected to the middle RDL, on the upper surface of the insulation substrate; and
   applying a tenting etch process on the conductive layer to form the first upper RDLs.

19. The method of claim 14, wherein the portions of the molding member on the upper surfaces of the insulation substrate and the first upper RDLs are removed using a laser.

20. The method of claim 14, wherein the removing the portions of the molding member on the upper surfaces of the insulation substrate and the first upper RDLs to expose the first upper RDLs comprises removing a portion of the molding member on the semiconductor chip to expose the upper surface of the semiconductor chip.

* * * * *